United States Patent [19]

Onaya et al.

[11] Patent Number: 5,576,709
[45] Date of Patent: Nov. 19, 1996

[54] DELAY CIRCUIT USING A DIGITAL MEMORY

[75] Inventors: Masato Onaya, Gunma-Ken; Tsutomu Ishikawa, Ota, both of Japan

[73] Assignee: Sanyo Electric Co., Ltd., Osaka, Japan

[21] Appl. No.: 267,477

[22] Filed: Jun. 28, 1994

[30] Foreign Application Priority Data

Jun. 30, 1993 [JP] Japan .................................. 5-189095
Jul. 21, 1993 [JP] Japan .................................. 5-179515

[51] Int. Cl.$^6$ .................................................. H03M 1/00
[52] U.S. Cl. ........................................................ 341/110
[58] Field of Search ..................................... 341/110, 144, 341/155, 140, 152, 166

[56] References Cited

U.S. PATENT DOCUMENTS 4,219,880  8/1980  Nichols ................................. 364/718
4,308,585  12/1981  Jordan ................................. 395/115

FOREIGN PATENT DOCUMENTS 60-185285  9/1985  Japan .
2130422  5/1984  United Kingdom .

OTHER PUBLICATIONS

European Search Report, dated Mar. 24, 1995, Appl. No. 94304767.0.
Ishikawa, et al., "One–bit A/D D/A Converters IC for Audio Delay", IEEE Transactions on Consumer Electronics, vol. 35, No. 4, Nov. 1989.

European Search Report, dated Jul. 18, 1995, Appl. No. 94304767.0.

K. J. Dimmler, et al., "New 64K Memory Chip Gets the Picture", AT&T Bell Laboratories Record, No. 1, Jan. 1985.

T. Ishikawa, et al., "One–Bit A/D Converters IC For Audio Delay", IEEE Transactions on Consumer Electronics, vol. 35, No. 4, Nov. 1989, pp. 767–773.

*Primary Examiner*—Brian K. Young
*Attorney, Agent, or Firm*—Loeb & Loeb LLP

[57] ABSTRACT

An adder 22, a quantizer 20, and a variable integrator 24 execute A/D conversion and the result is stored in a memory 12. A time constant of the variable integrator at this time is controlled by a time constant controller 25. On the other hand, data from the memory is integrated by a variable integrator 28 to provide an analog signal. At this time, control data of the time constant controller 25 is transferred via a memory 32 to a time constant controller 33, which then uses the transferred control data to control the time constant of the variable integrator 28. When a mode is changed, switches 34 and 35 are turned off. Therefore, a signal with no input can be written into the memory 12 for initializing the memory 12.

9 Claims, 11 Drawing Sheets

| S1 | S2 | S3 | S4 | OUT-PUT 1 | OUT-PUT 2 |
|---|---|---|---|---|---|
| 0 | 0 | 0 | 0 | L | L |
| 1 | 0 | 0 | 0 | L | L |
| 0 | 1 | 0 | 0 | L | L |
| 1 | 1 | 0 | 0 | L | L |
| 0 | 0 | 1 | 0 | H | L |
| 1 | 0 | 1 | 0 | H | L |
| 0 | 1 | 1 | 0 | H | H |
| 1 | 1 | 1 | 0 | H | H |
| 0 | 0 | 0 | 1 | H | H |
| 1 | 0 | 0 | 1 | H | H |
| 0 | 1 | 0 | 1 | H | L |
| 1 | 1 | 0 | 1 | H | L |
| 0 | 0 | 1 | 1 | L | L |
| 1 | 0 | 1 | 1 | L | L |
| 0 | 1 | 1 | 1 | L | L |
| 1 | 1 | 1 | 1 | L | L |

Fig. 9

| UP COUNT | | | | | DOWN COUNT | | | | |
|---|---|---|---|---|---|---|---|---|---|
| Q1 | Q2 | Q3 | Q4 | Q5 | Q1 | Q2 | Q3 | Q4 | Q5 |
| 1 | 1 | 1 | 0 | 0 | 1 | 1 | 1 | 1 | 1 |
| 1 | 1 | 1 | 1 | 0 | 0 | 1 | 1 | 1 | 1 |
| 1 | 1 | 1 | 0 | 1 | 1 | 0 | 1 | 1 | 1 |
| 1 | 1 | 1 | 1 | 1 | 0 | 0 | 1 | 1 | 1 |
| 1 | 1 | 1 | 0 | 0 | 1 | 1 | 0 | 1 | 1 |
| 1 | 1 | 1 | 1 | 0 | 0 | 1 | 0 | 1 | 1 |
| 1 | 1 | 1 | 0 | 1 | 1 | 0 | 0 | 1 | 1 |
| 1 | 1 | 1 | 1 | 1 | 0 | 0 | 0 | 1 | 1 |
| 1 | 1 | 1 | 0 | 0 | 1 | 1 | 1 | 0 | 1 |
| 1 | 1 | 1 | 1 | 0 | 0 | 1 | 1 | 0 | 1 |
| 1 | 1 | 1 | 0 | 1 | 1 | 0 | 1 | 0 | 1 |
| 1 | 1 | 1 | 1 | 1 | 0 | 0 | 1 | 0 | 1 |

Fig. 11

DELAY CIRCUIT USING A DIGITAL MEMORY

BACKGROUND OF THE INVENTION

1. Field of the Invention

This invention relates to a delay circuit using an A/D converter, a memory, and a D/A converter used to produce a surround sound of an audio machine, etc.

2. Description of the Related Art

Hitherto, a surround sound of an audio machine has been produced by delaying a reproduced sound for a predetermined time, attenuating, and superposing the resulting sound. Such reproduction modes as a stadium mode and a church mode adapt different manners of delaying and superposing reproduced sounds.

One of the delay circuits used for such purposes is shown in FIG. 1. In the circuit, an analog reproduction signal is temporarily converted into digital data by an A/D converter 10 and the digital data is stored in a memory 12. The data read from the memory 12 is converted back into analog data by a D/A converter 14. In the circuit, the delay of the read timing from the write timing is varied and the difference therebetween becomes a delay time.

Used as the A/D converter 10 is one as shown in FIG. 2. The A/D converter 10 comprises an adder 20, a quantizer 22, a variable integrator 24, and a time constant controller 26; an analog output of the variable integrator 24 is fed back into the adder 20 to which an analog signal is input. The quantizer 22 comprises a comparator 22a which outputs high or low in response to input signal voltage and a latch circuit 22b which latches the output of the comparator 22a in response to a predetermined clock for converting an input signal into a 1-bit digital signal. The variable integrator 24 integrates outputs of the quantizer 22 for providing an analog signal corresponding to the input signal. The output of the variable integrator 24 is fed back into the adder 20, which then finds a difference between both the signals; for the input signal with no change, the quantizer 22 outputs high and low alternately.

On the other hand, the controller 26 changes a time constant in the variable integrator 24 in response to the output condition of the quantizer 22. That is, if the output level of the adder 20 is large and the quantizer 22 makes an unbalanced output between "0" and "1," the time constant of the variable integrator 24 is made small; if the output level of the adder 20 is small and the quantizer 22 outputs "0" and "1" keeping a balance therebetween, the time constant of the variable integrator 24 is made large. Under such control, when there is no sound, the time constant can be made large to suppress occurrence of high-frequency noise; when the input signal changes, the time constant can be made small to output a high tone sufficiently.

On the other hand, the D/A converter 14 comprises a latch circuit 27, a variable integrator 28, and a time constant controller 29, as shown in FIG. 3. A pulse-string input signal read from the memory 12 is latched in the latch circuit 27, then integrated by the variable integrator 28 to provide an analog signal. Here, a time constant in the variable integrator 28 is controlled by a signal from the time constant controller 29 which has the same configuration as the time constant controller 26 shown in FIG. 2. That is, the time constant controller 29 detects the level of an input signal and controls the time constant of the variable integrator 28 accordingly. Since the input and output signals of the memory 12 are basically the same, such control enables the time constant of the variable integrator 28 to match with that of the variable integrator 24 for delaying the same signal as the input signal for a predetermined time for output.

However, in such a conventional delay circuit, the conversion characteristics of the A/D converter 10 cannot match those of the D/A converter 14 completely, causing a level change, etc., to occur, leading to a mismatch between the input and output analog signals. That is, generally, analog circuits such as CR low-pass filters are used as the time constant controllers 26 and 29 and the characteristics of these circuits change due to temperature changes, etc. Thus, it is difficult to completely match the characteristics between the two time constant controllers 26 and 29; a mismatch occurs in signals.

If the delay time is changed to alter the reproduction mode in the conventional delay circuit, the read timing from the memory 12 will be changed. If the read timing is simply changed, control of the A/D converter 10 and that of the D/A converter 14 cannot be made the same and the delay signal becomes different from the input signal, making the listener feel a sense of acoustic disorder. Then, to change the reproduction mode, the memory 12 may be initialized with its output disabled. However, such initialization of the memory requires a circuit configuration to initialize the memory 12.

SUMMARY OF THE INVENTION

It is therefore an object of the invention to provide a delay circuit which can easily match input and output signals.

It is another object of the invention to provide a delay circuit which can perform processing such as changing the delay time without requiring initialization of memory.

To these ends, according to the invention, there is provided a delay circuit for converting an analog signal into a digital signal and delaying the resultant digital signal, then converting the delayed digital signal into an analog signal for output, the delay circuit comprising:

an A/D converter for converting an input analog signal into a pulse string signal, the conversion characteristics of the A/D converter being controlled in response to a state of the pulse string digital signal output;

a memory for storing the pulse string signal output from the A/D converter as data of 1, 0;

a D/A converter for converting the pulse string signal output from the memory into an analog signal; and means for transferring data on the conversion characteristics of the A/D converter to the D/A converter.

Thus, the conversion characteristics of the D/A converter are controlled in response to the data on the conversion characteristics of the A/D converter. For this reason, the conversion characteristics of both the converters can be easily matched and the input and output analog signals can be made the same.

According to the invention, the A/D converter may comprise:

a quantizer for quantizing an analog signal for outputting a pulse string signal;

a variable integrator for integrating the output of the quantizer with any desired time constant;

an adder for adding the input analog signal and an output of the variable integrator and supplying the result of the addition to the quantizer;

change direction detection means for detecting the direction in which an input signal change becomes large or small; and control means responsive to the detected direction for changing the time constant of the variable integrator, the transfer means for transferring data on the time constant of the variable integrator in the A/D converter, the D/A converter comprising:

a variable integrator for integrating the pulse string signal with any desired time constant; and control means responsive to the time constant transferred via the transfer means for changing the time constant of the variable integrator.

Thus, the time constants in the variable integrators in the A/D and D/A converters are made the same, thereby matching the conversion characteristics. Particularly, the change direction detection means and the control means of the A/D converter are made of a digital circuit and variable integrator control data provided by the digital circuit is supplied to the D/A converter, thereby adjusting the conversion characteristics very accurately. For example, memory can be used to transfer the data. If the control means in the D/A converter is also made of a digital circuit, supplied digital data can be used to perform preferred time constant control.

The transfer means can include a time constant memory, and data on the time constant of the variable integrator in the A/D converter can be written into the time constant memory and read from the time constant memory for changing the time constant of the variable integrator in the D/A converter.

The delay circuit can further include means for controlling a read timing of the time constant memory. In this case, the timing control means synchronizes the read timing from the time constant memory to that from the memory for matching the time constant of the variable integrator in the A/D converter at A/D conversion with that of the variable integrator in the D/A converter at D/A conversion.

Thus, the time constants of the variable integrators in the A/D and D/A converters can be easily matched.

The change direction detection means can detect high duration and low duration of the pulse string signal output by the quantizer for detecting the input signal change direction.

According to the invention, there is provided a delay circuit for converting an analog signal into a digital signal and delaying the resultant digital signal, then converting the delayed digital signal into an analog signal for output, the delay circuit comprising:

an A/D conversion section for converting an analog input signal into digital data in sequence;

a memory for storing the digital data from the A/D conversion section in sequence;

means for reading data written a predetermined time before, among the data stored in the memory;

read control means responsive to a delay time instruction for controlling the data read at the read means;

a D/A conversion section for converting the data read from the memory into an analog signal in sequence and outputting a delay signal;

an input switch being located on an input route of the analog signal to the A/D conversion section for controlling input of the input signal to the A/D conversion section;

an output switch being located on an output route from the D/A conversion section for controlling signal output; and control means, when a delay time is switched according to the delay time instruction, for controlling the input and output switches for disabling input of input signal and output of output signal for a predetermined time.

Thus, when the delay time is changed to change the reproduction mode, the control means turns off the input switch to mute the input signal, thereby writing data of a silent state into the memory for initializing the memory. Therefore, reliable initialization of the memory can be accomplished by the simple configuration.

The delay time instruction may be an instruction for a reproduction mode.

Therefore, when the user changes the reproduction mode, different conversion characteristics can be prevented from causing an output, which makes the user to feel a sense of acoustic disorder, to occur.

The time during which input of input signal and output of output signal are disabled by the control means may be at least the time required to clear the contents of the memory.

The read control means can invert a predetermined bit of an address signal for accessing the memory, thereby changing the address signal, and changing the delay time.

This enables the delay time to be changed easily.

BRIEF DESCRIPTION OF THE DRAWINGS

In the accompanying drawings:

FIG. 9 is an illustration showing the count state of the counter 50;

FIG. 11 is an illustration showing the flip-flop state in the time constant change circuit.

DESCRIPTION OF THE PREFERRED EMBODIMENTS

Referring now to the accompanying drawings, there are shown preferred embodiments of the invention.

[Description of entire configuration]

Figure 1:
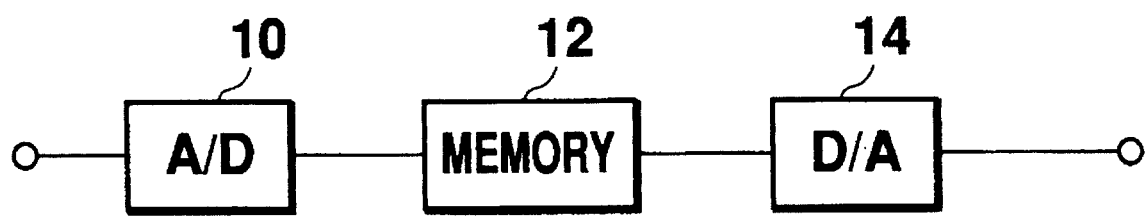
FIG. 1 is a block diagram showing the schematic configuration of a conventional delay circuit.
Figure 2:
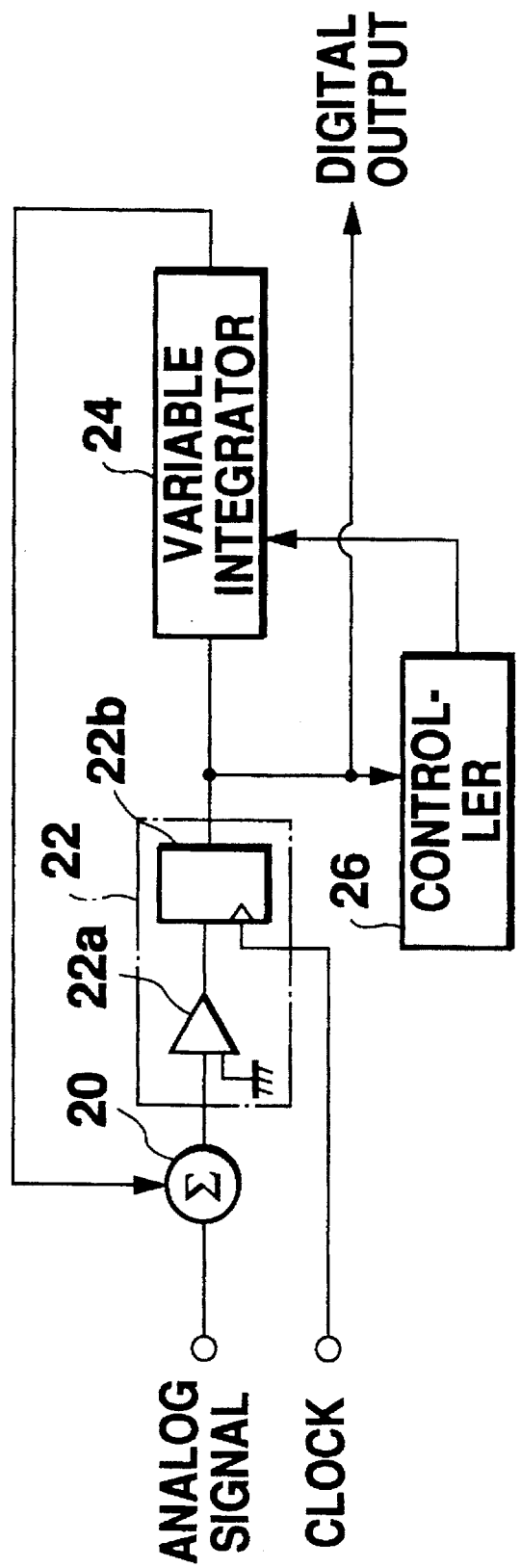
FIG. 2 is a block diagram showing a configuration example of an A/D converter in a conventional delay circuit.
Figure 3:
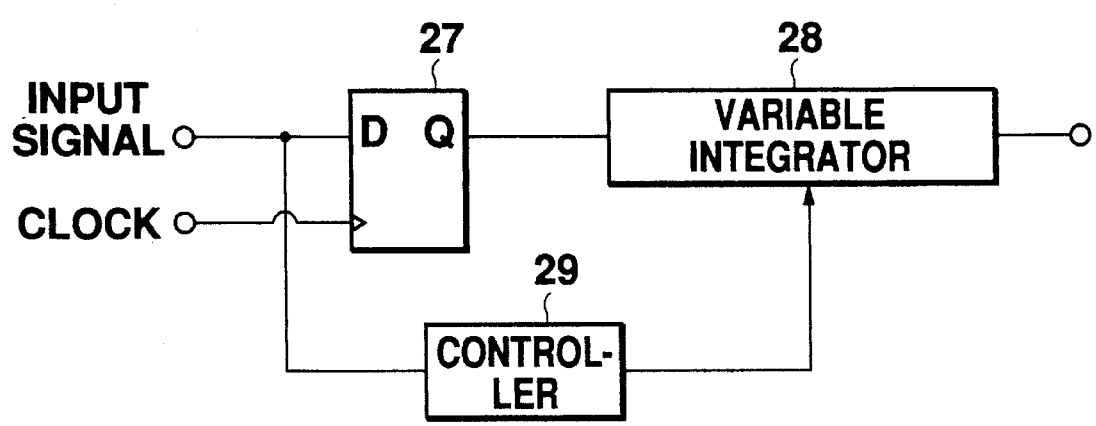
FIG. 3 is a block diagram showing a configuration example of a D/A converter in a conventional delay circuit.
Figure 4:
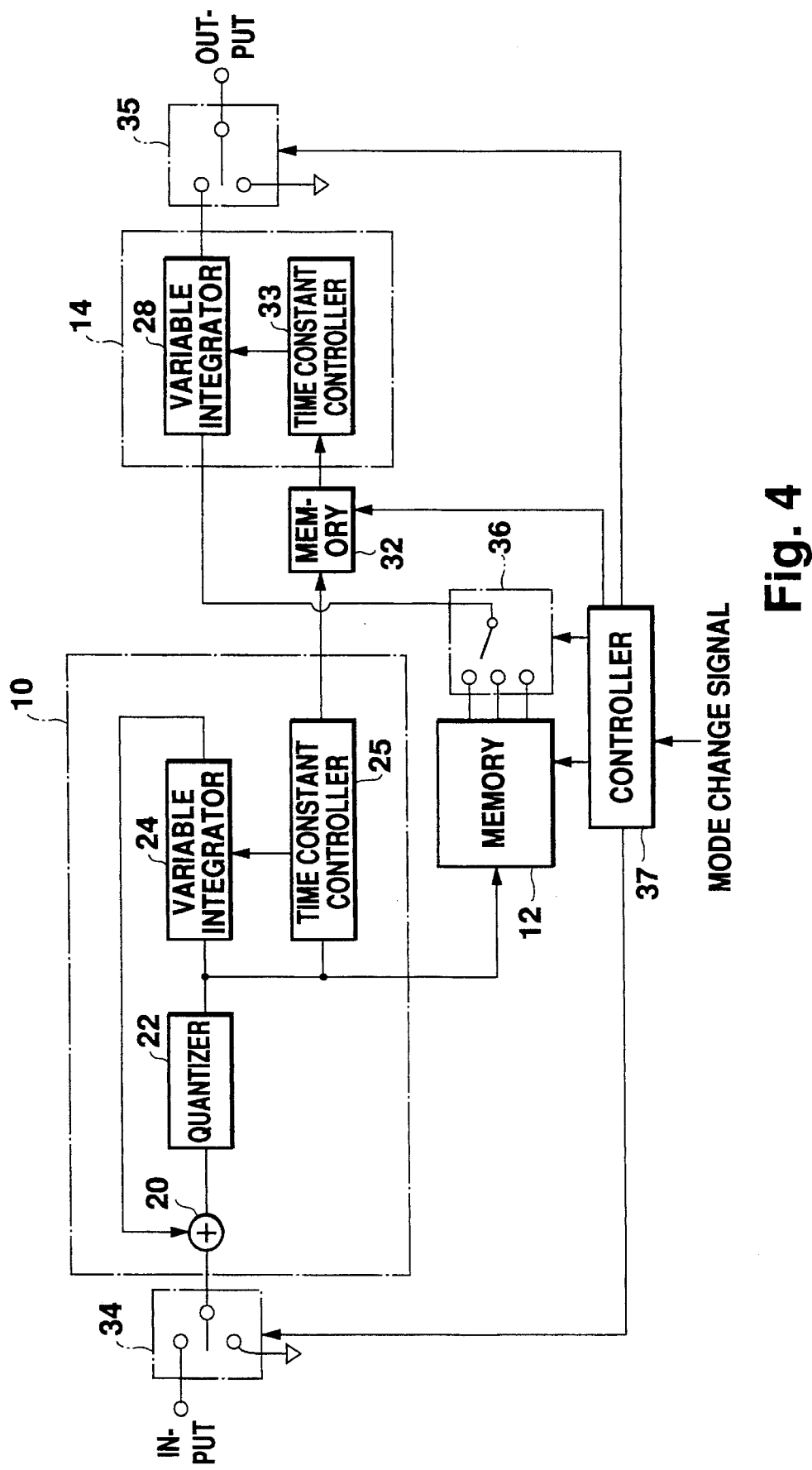
FIG. 4 is a block diagram showing the entire configuration of a delay circuit according to the invention.

FIG. 4 is a block diagram showing the entire configuration of a delay circuit according to one embodiment of the invention, wherein a memory 32 is provided to transfer time constant control data from an A/D converter 10 to a D/A converter 14. A time constant controller 25 in the A/D converter 10 is made of a digital circuit and time constant control data, an output of the time constant controller 25 is stored in the memory 32. Data in the memory 32 is read in synchronization with actual data read from a memory 12 and is supplied to the time constant controller 33. Then, the time constant controller 33 needs only to control a time constant of a variable integrator 28 based on the supplied data and does not require a circuit for level detection, etc. The D/A converter 14 may be provided with a latch circuit 27 at the preceding stage of the variable integrator 28, as in FIG. 3. The configuration of the A/D converter 10 is similar to that of the conventional A/D converter in FIG. 2.

Thus, in the embodiment, the time constant control data in the A/D converter 10 is supplied via the memory 32 to the D/A converter 14 for controlling the time constant of the variable integrator 28 in the D/A converter 14. Therefore, the conversion characteristics of the A/D converter 10 are matched accurately with those of the D/A converter 14 for providing a preferred delay circuit. Further, the time constant control data is transferred via the memory 32, and thus can be easily synchronized with actual data transferred via the memory 12.

The delay circuit in the embodiment further includes a switch 34 installed in an input route of analog signals, a switch 35 installed in an output route of analog signals, a switch 36 for controlling read locations from the memory, and a controller. The controller 37 controls switching of the switches 34, 35, and 36, and also controls a read/write at the memories 12 and 32. Therefore, it is very easy to synchronize data read from the memories 12 and 32 with each other.

[Mode change processing]

In the mode such as stadium, a signal of a long delay time is generated because an echo resembling that in a wide space is required; in the mode such as church, a signal of a short delay time is generated. For this purpose, the switch 36 is used to change the data read timing from the memory 12.

When a mode change signal is generated by the user handling a switch, etc., the mode change signal is input to the controller 37, which then connects each of the switches 34 and 35 to a dummy terminal (lower position in FIG. 4) for disabling signals from being input or output. The dummy terminals are at the reference potential of the same potential as the bias level of an input signal. In this state, the switch 36 is switched to change the data read timing. As the read timing is changed, the delay time of an output signal from an input signal is changed. Since digital data into which input signals are converted is written into the memory 12 in sequence, data is read from the address where the data has been written a predetermined time before, thereby providing predetermined delay data. In the mode such as stadium, a signal of a long delay time is generated because an echo resembling that in a wide space is required; in the mode such as church, a signal of a short delay time is generated. For this purpose, the switch 36 is used to change the read timing.

In FIG. 4, the switch 36 is described as a mechanical switch; in fact, the function is carried out by changing the read address from the memory 12. That is, a predetermined bit of an address signal determining the location of the memory 12 to be accessed may be inverted to change the read timing. If the third bit of the write address signal is inverted, an access will always be made to the address four bits apart. Then, the switch 36 can be made of a switch for controlling whether or not an inverter is to be operated.

Figure 5:
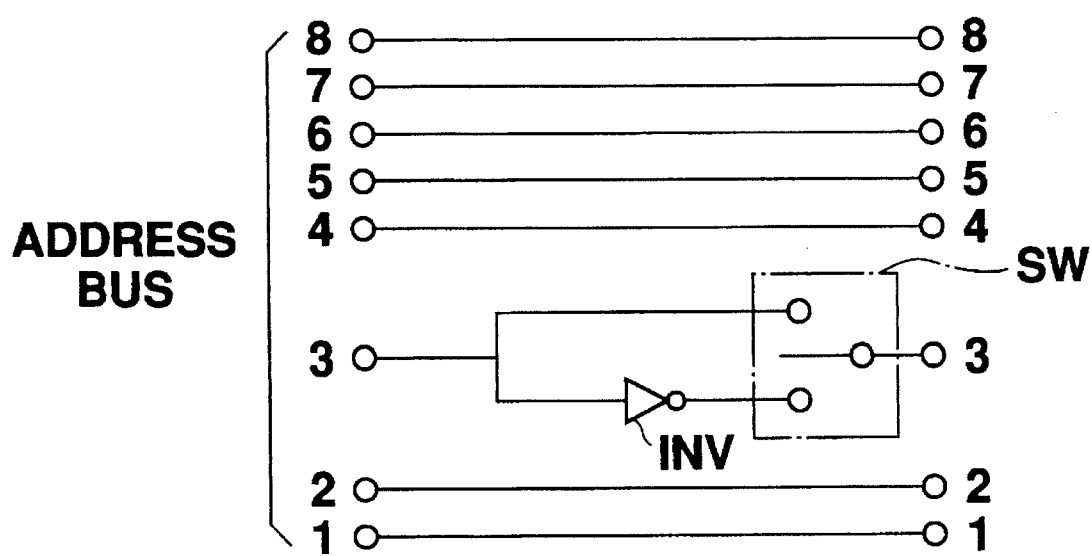
FIG. 5 is a drawing showing a circuit for changing an address.

For example, as shown in FIG. 5, the third bit of an 8-bit address bus may be provided with a switch SW for selecting a signal passed through an inverter INV or a signal not passed therethrough and the switch SW may be controlled.

In the example, before such a switch SW is switched, the switches 34 and 35 are handled to mute data input and disable output. When no data is input, the A/D converter outputs data meaning no signal. The data is, for example, a given signal of an alternative data pattern of "1" and "0." Then, the data is written into the memory 12, thereby producing the same effect as initializing the memory 12. Since output is also disabled, a strange signal will not be output. The input mute period is the time required to initialize the memory 12.

After termination of such processing, if the switches 34 and 35 are turned on and A/D conversion is started, different conversion characteristics between A/D conversion and D/A conversion can be prevented from causing an output, making the listener feel a sense of acoustic disorder, to occur.

Thus, according to the invention, the memory can be initialized by muting an input signal. Therefore, a circuit for initialization is very simplified to ensure the operation thereof.

[Configuration of time constant controller 25]

Figure 6:
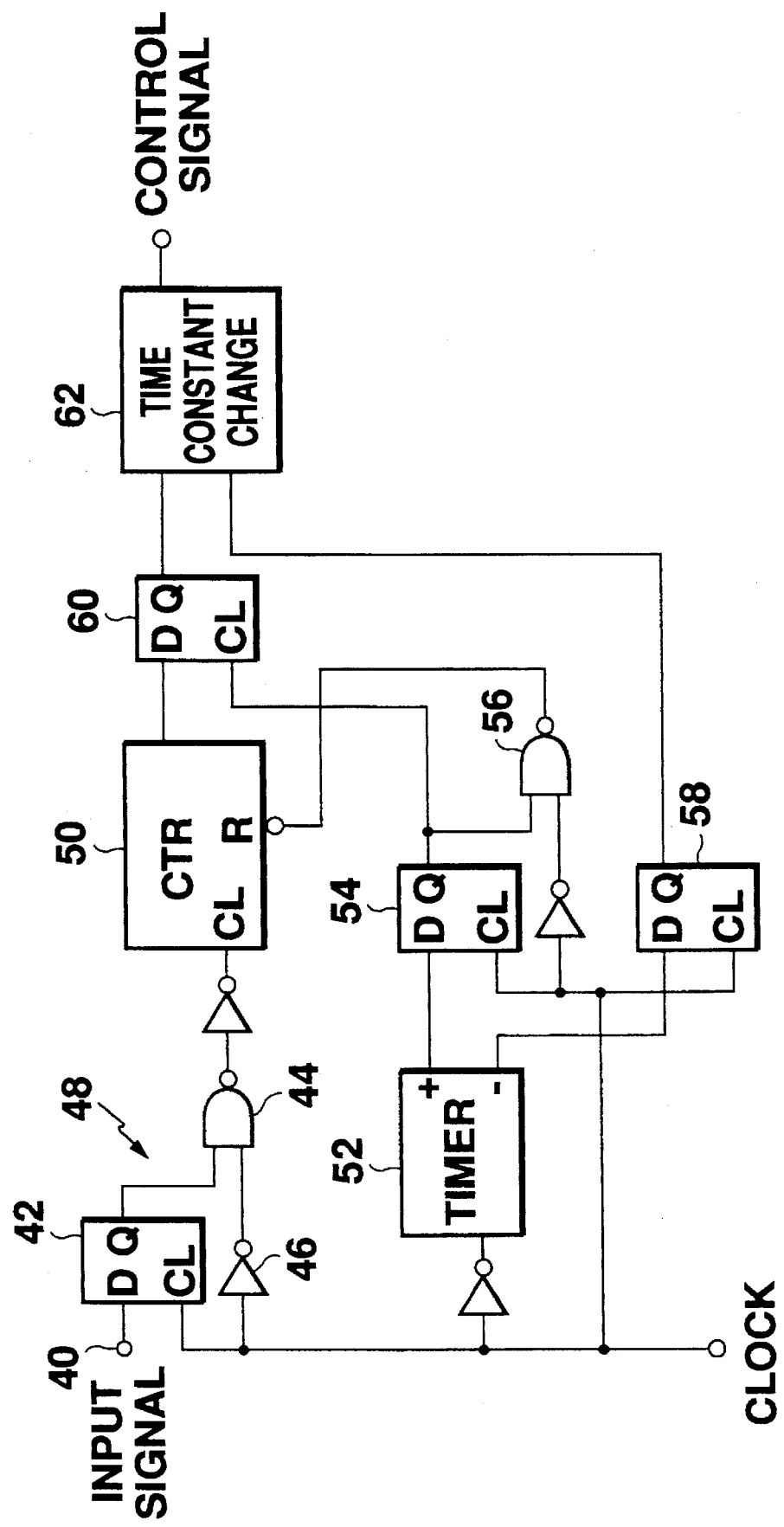
FIG. 6 is a block diagram showing the configuration a main section of a time constant controller.

In the embodiment, the time constant controller 25 is made of a digital circuit. FIG. 6 shows the configuration of a main section of the time constant controller 25. A pulse string signal output from a quantizer 22 is input through an input terminal 40 to a D input terminal of a D flip-flop 42. A predetermined clock is input to a CL input terminal of the D flip-flop 42. A Q output of the D flip-flop 42 is input to one input terminal of a NAND gate 44. The clock is input via an inverter 46 to the other input terminal of the NAND gate 44. The D flip-flop 42, the NAND gate 44, and the inverter 46 make up an input signal sampling circuit 48. An output of the NAND gate 44 is inverted, then input to a CL input terminal of a counter 50 for counting outputs of the sampling circuit 48.

Also, the clock is input to a timer 52, which then counts the clock and when a predetermined time has elapsed, generates an output signal. The output signal of the timer 52 is input to a D input terminal of a D flip-flop 54, and the clock is supplied to a CL input terminal of the D flip-flop 54. Therefore, the output of the timer 52 is held in the D flip-flop 54. A Q output of the D flip-flop 54 is input to one input terminal of a NAND gate 56 and an inverted clock is input to the other input terminal of the NAND gate 56. An output of the NAND gate 56 is inverted and supplied to a reset terminal of the counter 50. Therefore, when the timer times out, the counter 50 is reset. The output of the timer 52 is also supplied to a D input terminal of a D flip-flop 58 having a CL input terminal to which the clock is supplied. Thus, the output of the timer 52 is also held in the D flip-flop 58.

On the other hand, an output of the counter 50 is supplied to a D input terminal of a D flip-flop 60 and a Q output of the D flip-flop 54 is supplied to a CL input terminal of the D flip-flop 60. Thus, when the timer 52 outputs a time-out, the output of the counter 50 is latched in the D flip-flop 60. Q outputs of the D flip-flops 58 and 60 are supplied to a time constant change circuit 62.

Next, the operation of the circuit in FIG. 6 will be discussed. The pulse string input signal output from the quantizer 22 is applied to the input terminal 40 and is sampled by the sampling circuit 48 in response to the clock signal applied to the CL terminal. The clock signal is a signal having a sufficiently higher frequency than the input signal. On the other hand, the timer 52 counts the clock signal, and when counting a predetermined number of clock signals (when a predetermined time has elapsed), outputs high at a+terminal of an output terminal and low at a−terminal. The D flip-flop 54 outputs a signal which goes high only for one clock after the time-out; the D flip-flop 58 outputs a signal which goes low for only one clock after the time-out.

The counter 50 counts output signals from the sampling circuit 48 for the predetermined time set in the timer 52. The D flop-flop 42 in the sampling circuit 48 takes in the input signal on the rising edge of a clock signal. When the clock signal is low and the D flip-flop 42 outputs high, the NAND gate 44 supplies high to the counter 50. Therefore, the count value corresponding to the time during which the input signal is high is set in the counter 50. That is, when the input signal contains a large high portion, the count value of the counter 50 increases; when the input signal contains a large low portion, the count value of the counter 50 decreases. Output of the NAND gate 56 is inverted and supplied to the reset terminal of the counter 50. When time-out output of the timer 52, which is high, is taken in the D flip-flop 54 and the clock signal goes low, the NAND gate 56 outputs high. Therefore, when the timer 52 times out, the counter 50 is reset.

On the other hand, when the time-out output of the timer 52, which is high, is taken in the D flip-flop 54, the high output is supplied to the CL terminal of the D flip-flop 60, which then takes in output of the counter 50 and outputs it through the Q output terminal.

[Configuration of counter 50]

Figure 7:
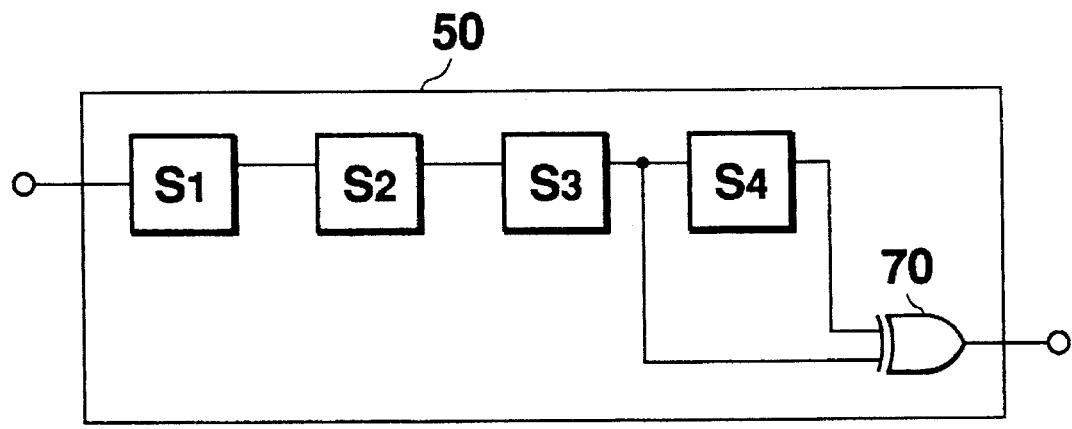
FIG. 7 is a block diagram showing a configuration example of a counter 50.
Figure 8:
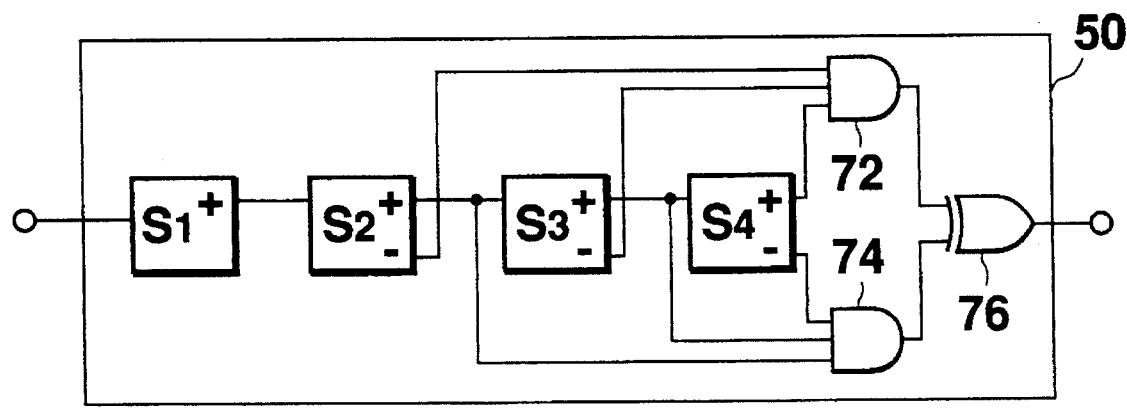
FIG. 8 is a block diagram showing another configuration example of the counter 50.

The counter 50 is a 4-bit counter having a decoder to generate an output, for example, as shown in FIG. 7. In the example in FIG. 7, an exclusive-OR gate 70 having input terminals connected to the Q outputs at the third and fourth bits is provided as the decoder. FIG. 8 shows another example of the counter 50, wherein the decoder consists of a first AND gate 72 having input terminals connected to the inverted Q outputs at the second and third bits and the Q output at the fourth bit, a second AND gate 74 having input terminals connected to the Q outputs at the second and third bits and the inverted Q output at the fourth bit, and an exclusive-OR gate 76 to which outputs of the first and second AND gates 72 and 74 are applied.

In FIG. 7, when only either of the Q outputs at the third and fourth bits is high, the exclusive-OR gate 70 of the counter 50 generates an output high; otherwise, it generates an output low, as shown under Output 1 in FIG. 9. Thus, if the input signal applied to the input terminal 40 (output of the quantizer 22) is a signal containing unbalanced components between high and low, a low output is generated; if the signal contains a substantially equal balance therebetween, a high output is generated. Therefore, when the input signal state changes, the counter 50 outputs low. In the example in FIG. 8, the counter 50 outputs as shown under Output 2 in FIG. 9. Thus, when the counter 50 in FIG. 8 is used, the high output range is narrower than that when the counter 50 in FIG. 7 is used.

[Transfer of time constant control data]

The output of the counter 50 held by the D flip-flop 60 is applied to the time constant change circuit 62 as up or down data. That is, up data for reducing the time constant is supplied to the time constant change circuit 62 as low; down data for increasing the time constant is supplied as high. On the other hand, the output of the D flip-flop 58 is applied to the time constant change circuit 62 as a clock.

The time constant change circuit 62 consists of a normal counter. High pulses supplied from the D flip-flop 60 are counted with the signal supplied from the D flip-flop 58 as a clock, and when the count reaches a predetermined number, for example, several bits, a signal for controlling the time constant of the variable integrator 24 is generated. For example, when outputs low of the D flip-flop 60 are counted up by the counter, the time constant of the variable integrator 24 is reduced by a predetermined control amount. Therefore, if the D flip-flop 60 continues to output low, the time constant of the variable integrator 24 is reduced accordingly.

The time constant control data output by the time constant change circuit 62 is delayed via the memory 32 by only as long as it takes to read data from the memory 12, for transfer to the time constant controller 33. Then, the time constant controller 33 controls the variable integrator 28 in response to the transferred time constant control data so as to make the time constant in the variable integrator 28 of the D/A converter 14 the same as that in the variable integrator 24 of the A/D converter 10, thereby matching the signal levels of input and output signals. Particularly, when the input signal level greatly changes, a preferred delay can also be made.

In the example, the final output of the time constant controller 25 is transferred from the A/D converter to the D/A converter, but instead the counter value may be transferred, for example. The output signal of the counter 50 may also be transferred. In this case, the memory 32 can be made of a shift register for delaying a predetermined time.

[Configuration of time constant change circuit 62]

Figure 10:
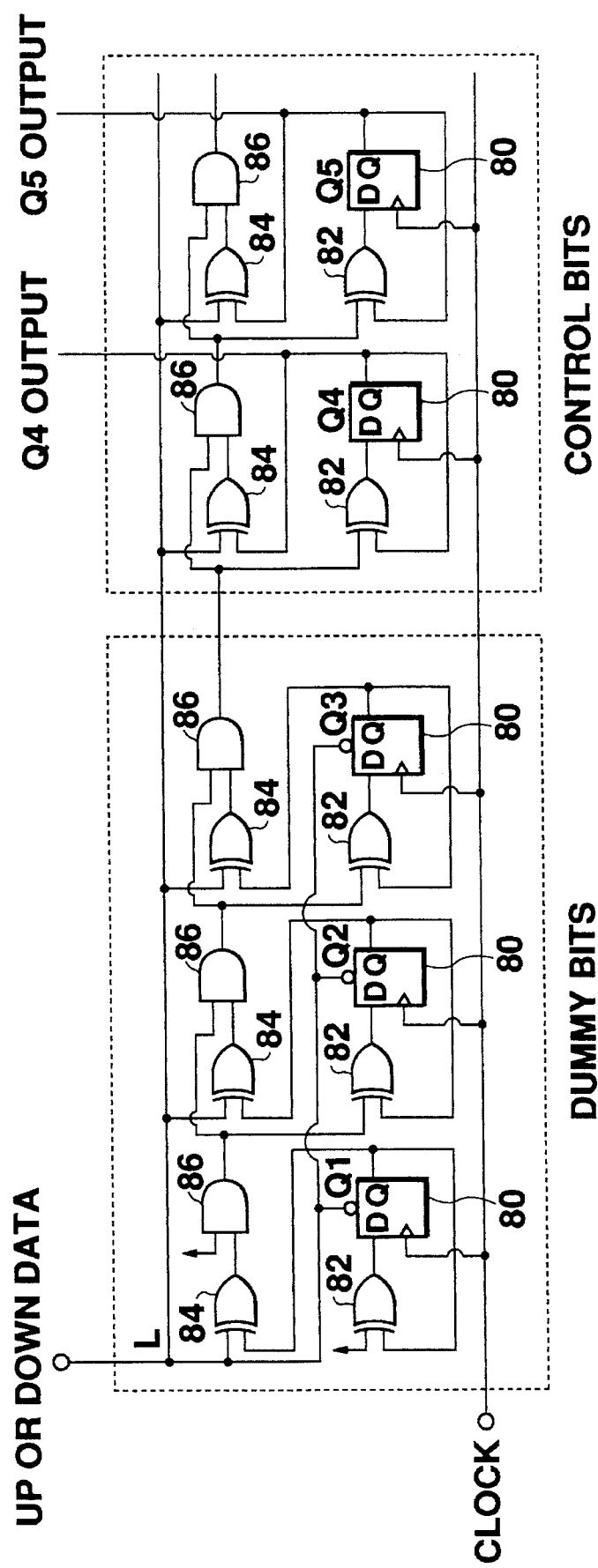
FIG. 10 is a block diagram showing the configuration of one example of a time constant change circuit.

FIG. 10 shows a configuration example of the time constant change circuit 62. In this example, the number of bits of the internal counter is changed at up counting and down counting. Each bit of the counter has a D flip-flop 80, an exclusive-OR gate 82 connected to a D input terminal of the D flip-flop 80, an exclusive-OR gate 84, and an AND gate 86. A Q output of the D flip-flop 80 is output via the exclusive-OR gate 84 and the AND gate 86. The Q output of the D flip-flop 80 is input to one input terminal of the exclusive-OR gate 82 and an output from the D flip-flop 60 is input to one input terminal of the exclusive-OR gate 84.

Other input terminals of the exclusive-OR gate 82 and the AND gate 86 of the least significant bit (LSB) are pulled high to a power supply. Bit output at the preceding stage, namely, output of the AND gate 86 of the preceding bit is input to other input terminals of the exclusive-OR gate 82 and the AND gate 86 of each bit other than the LSB. The output of the D flip-flop 60 is inverted and input to a preset terminal (when low is input, "1" is preset) of the D flip-flop 80 of each dummy bit. Thus, when the output of the D flip-flop 60 is low (the time constant is changed to a smaller value), the D flip-flops 80 of the dummy bits are all set high, namely, to "1" and an output of the AND gate 86 of the third dummy bit also goes high. Further, a low signal is supplied to one input terminal of the exclusive-OR gate 84 of each bit. Therefore, in each control bit, high Q output of the flip-flop 80 is transferred as a carry via the AND gate 86 and the exclusive-OR gate 82. In this state, output of the flop-flop 58 is supplied to the flip-flops 80 of the control bits as a clock, thus the control bits serve as a normal 2-bit up counter.

On the other hand, when the output of the D flip-flop 60 is high (the time constant is changed to a greater value), the signal supplied to the preset terminal of the flip-flop 80 of each dummy bit is low. For this reason, preset operation is not performed at the flip-flops 80, thus all the flip-flops 80 perform normal operation. High signal is supplied to one input terminal of the exclusive-OR gate 84 of each bit. Therefore, for all bits, low Q output of the flip-flop 80 is transferred as a carry for setting the D flip-flop 80 low via high output of the exclusive-OR gate 84 and high output of the AND gate 86. In this state, output of the flop-flop 58 is supplied to the flip-flops 80 of the control bits as a clock, thus the control bits serve as a normal 2-bit down counter.

Figure 12:
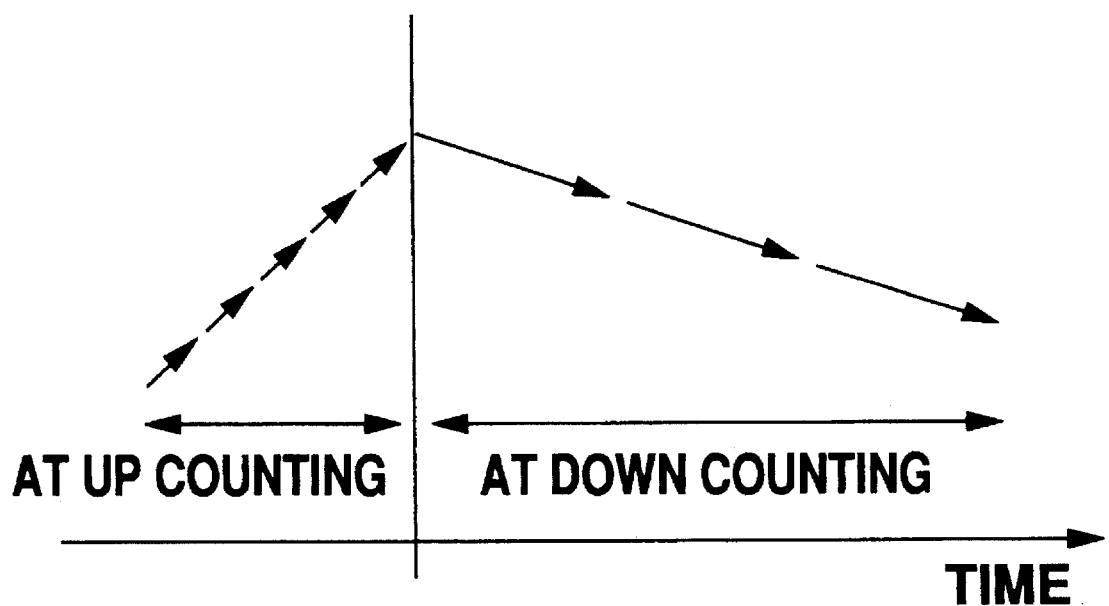
FIG. 12 is an illustration showing how a time constant changes.

The count state is shown in FIG. 11. Thus, the time constant change circuit in the embodiment operates as a 2-bit counter at up counting and a 5-bit counter at down counting. Therefore, for example, if sound output becomes large from the silent state (attack), the time constant change circuit operates as a 2-bit up counter and outputs a signal for reducing the time constant upon output of the control bits set to "1" "1." In contrast, if sound output becomes small (recovery), it operates as a 5-bit down counter and outputs a signal for increasing the time constant upon output of the control bits set to "0" "0." Thus, the time constant changes rapidly for attack and gently for recovery, as shown in FIG. 12. In FIG. 11, the state until "0" "0" are output is not shown at down counting. When 64 is counted, "0" "0" are output.

Preferably, each of the variable integrators 24 and 28 is made of an analog integrator comprising capacitors, resistors, etc.,; a predetermined time constant is provided by changing the values of the capacitors, resistors, etc. Also, "1" "1" or "0" "0" output by the time constant change circuit 62 may be decoded and a counter whose count value is changed according to the decode value may be provided for setting the time constant of the variable integrator 24 according to the count value. Thus, the count value of the counter always corresponds to the time constant of the variable integrator 24, and the value can also be transferred via the memory 32 to the time constant control circuit 33 for setting the time constant of the variable integrator 28.

What is claimed:

1. A delay circuit for converting an input analog signal into a digital signal and delaying the resultant digital signal, then converting the delayed digital signal into an analog signal for output, said delay circuit comprising:

an A/D converter for converting the input analog signal into a pulse string signal, conversion characteristics of said A/D converter being controlled in response to a state of the pulse string signal output;

a memory for storing the pulse string signal output from said A/D converter as digital data and for outputting the pulse string signal delayed by a delayed period;

a D/A converter for converting the pulse string signal output from the memory into the analog signal for output; and means for transferring data on the conversion characteristics of said A/D converter to said D/A converter, wherein the A/D converter has a converting portion for converting the input analog signal into the pulse string signal and a control portion for generating a control signal in response to the state of the pulse string signal output, wherein the conversion characteristics of said converting portion are controlled in response to the control signal, wherein the means for transferring data transfers the control signal to the D/A converter after delaying the control signal by a predetermined period which corresponds to the delayed period of the pulse string signal output from the memory, and wherein the conversion characteristics of the D/A converter are controlled in response to the control signal provided from the means for transferring data.

2. A delay circuit for converting an input analog signal into a digital signal and delaying the resultant digital signal, then converting the delayed digital signal into an analog signal for output, said delay circuit comprising: an A/D converter for converting the input analog signal into a pulse string signal, conversion characteristics of said A/D converter being controlled in response to a state of the pulse string signal output;

a memory for storing the pulse string signal output from said A/D converter as digital data and for outputting the pulse string signal delayed by a delayed period;

a D/A converter for converting the pulse string signal output from the memory into the analog signal for output; and means for transferring data on the conversion characteristics of said A/D converter to said D/A converter, wherein said A/D converter comprises:

a quantizer for quantizing the input analog signal for outputting the pulse string signal;

a variable integrator for integrating the output of said quantizer with any desired time constant;

an adder for adding the input analog signal and an output of said variable integrator and supplying a result of the addition to said quantizer;

change direction detection means for detecting a direction in which the input signal change becomes large or small;

means for changing the time constant of said variable integrator in response to the detected direction; and means for transferring data on the time constant of said variable integrator in said A/D converter, said D/A converter comprising:

a variable integrator for integrating the pulse string signal with any desired time constant; and means for changing the time constant of said variable integrator in response to the time constant transferred via said transferring means.

3. The delay circuit as claimed in claim 2 wherein said transferring means includes a time constant memory whereby data on the time constant of said variable integrator in said A/D converter is written into said time constant memory and read from said time constant memory for changing the time constant of said variable integrator in said D/A converter.

4. The delay circuit as claimed in claim 3 further including means for controlling a read timing of said time constant memory, said controlling means for synchronizing the read timing from said time constant memory to that from said memory for matching the time constant of said variable integrator in said A/D converter at A/D conversion with that of said variable integrator in said D/A converter at D/A conversion.

5. The delay circuit as claimed in claim 2 wherein said change direction detection means detects high duration and low duration of the pulse string signal output by said quantizer for detecting the input signal change direction.

6. The delay circuit as claimed in claim 2 further including:

means for controlling a data read timing from said memory;

read control means for controlling the data read timing in response to a delay time instruction inputted from an external system;

an input switch being located on an input route of the analog signal to said A/D converter for controlling input of the input signal to said A/D converter;

an output switch being located on an output route from said D/A converter for controlling signal output; and means, when a delay time is switched according to the delay time instruction, for controlling said input and output switches for disabling input of an input signal and output of an output signal for a predetermined time.

7. A delay circuit for converting an analog signal into a digital signal and delaying the resultant digital signal, then converting the delayed digital signal into an analog signal for output, said delay circuit comprising:

an A/D conversion section for converting an analog input signal into digital data in sequence;

a memory for storing the digital data from said A/D conversion section in sequence;

means for reading data written a predetermined time before from among the data stored in said memory;

read control means for controlling the data read by said read means in accordance with a delay time instruction;

a D/A conversion section for converting the data read from said memory into an analog signal in sequence and outputting a delay signal;

an input switch being located on an input route of the analog signal to said A/D conversion section for controlling input of the input signal to said A/D conversion section;

an output switch being located on an output route from said D/A conversion section for controlling signal output; and means, when a delay time is switched according to the delay time instruction, for controlling said input and output switches for disabling input of input signal and output of output signal for a predetermined time.

8. The delay circuit as claimed in claim 7 wherein the time during which input of input signal and output of output signal are disabled by said control means is at least a time required to initialize contents of said memory.

9. The delay circuit as claimed in claim 7 wherein said read control means inverts a predetermined bit of an address signal for accessing said memory, thereby changing the address signal, thereby changing the delay time.

* * * * *